United States Patent [19]

Honma et al.

[11] Patent Number: 4,697,109
[45] Date of Patent: Sep. 29, 1987

[54] LEVEL CONVERTER CIRCUIT

[75] Inventors: Noriyuki Honma, Kokubunji; Goro Kitsukawa, Nishitama; Makoto Suzuki, Hachioji, all of Japan

[73] Assignee: Hitachi, Ltd., Tokyo, Japan

[21] Appl. No.: 751,864

[22] Filed: Jul. 5, 1985

[30] Foreign Application Priority Data

Jul. 5, 1984 [JP] Japan ............................. 139661

[51] Int. Cl.⁴ ................. H03K 19/092; H03K 19/086; H03K 19/003; H03K 17/10
[52] U.S. Cl. .................................. 307/475; 307/446; 307/450; 307/264; 330/300
[58] Field of Search ............... 307/475, 570, 446, 443, 307/450, 449, 355, 544, 248, 264

[56] References Cited

U.S. PATENT DOCUMENTS

| | | | |
|---|---|---|---|
| 3,823,330 | 7/1974 | Rapp | 307/475 |
| 4,321,491 | 3/1982 | Atherton et al. | 307/585 X |
| 4,326,136 | 4/1982 | LeCan et al. | 307/451 |
| 4,453,095 | 6/1984 | Wrathall | 307/446 X |

*Primary Examiner*—Stanley D. Miller
*Assistant Examiner*—David R. Bertelson
*Attorney, Agent, or Firm*—Antonelli, Terry & Wands

[57] ABSTRACT

Herein disclosed is a circuit for converting the logic amplitude of an ECL by logically amplifying a TTL or CMOS so that no substantial dc current flows in the steady state. The level converting circuit comprises: a level-shift circuit for generating a first output with a small level-shift and a second output with a larger level-shift than said first output; a CMOS circuit including a PMOS transistor having its gate fed with said first output, and an nMOS transistor having its gate fed with said second output; and a current switch for giving output levels to turn on said PMOS transistor and off said nMOS transistor at its high level and to turn on said PMOS transistor and off said nMOS transistor at its low level.

7 Claims, 31 Drawing Figures

FIG. 1
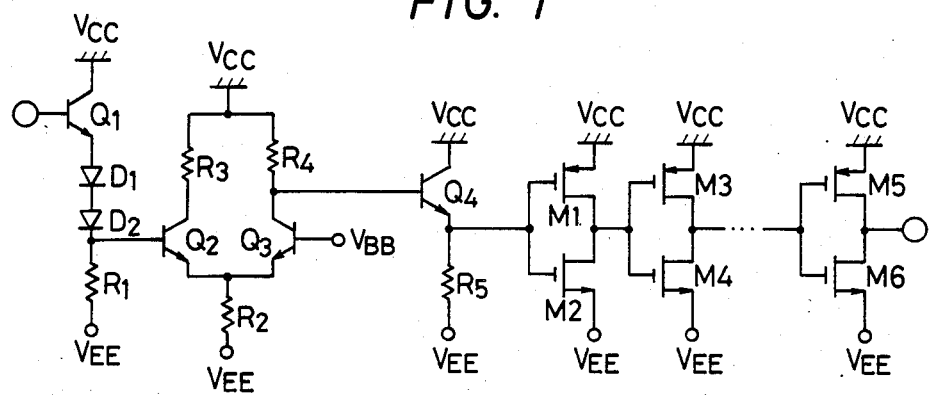
FIG. 2
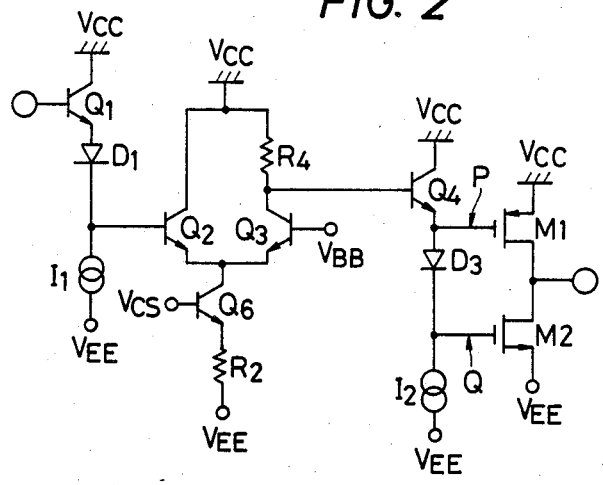
FIG. 3A   FIG. 3B   FIG. 3C   FIG. 3D   FIG. 3E
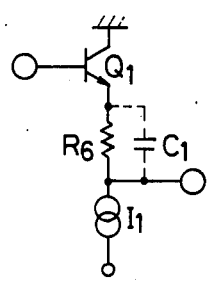 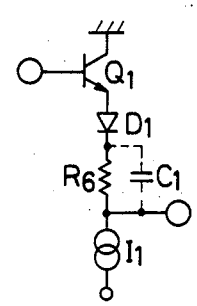 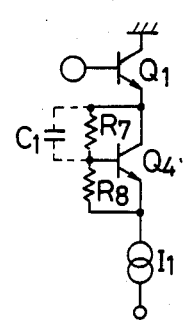 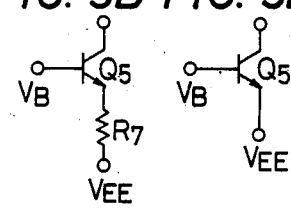
FIG. 3F
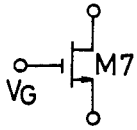

LEVEL CONVERTER CIRCUIT

BACKGROUND OF THE INVENTION

The present invention relates to a voltage level converter circuit and, more particularly, to a level converter circuit for converting a voltage level from the vicinity of an ECL (i.e., Emitter Coupled Logic) level to the vicinity of a CMOS (i.e, Complementary MOS) or TTL level.

The circuit which can operate at the highest speed of all the logic circuits used in the prior art is the ECL circuit which is composed of bipolar transistors. In case such an ECL circuit composed of bipolar transistors is made to coexist in one chip for use in a mixed circuit with either a CMOS circuit or a CMOS circuit and a bipolar transistor, a level change is required either from the ECL level to the CMOS level or between their neighborhood levels.

One example of such a level converter circuit is disclosed in Japanese Patent Laid-Open No. 50-142132.

SUMMARY OF THE INVENTION

An object of the present invention is to provide a level converter circuit in which no dc current flows in a steady state.

In order to achieve the above-specified object, according to the present invention, there is provided a level converter circuit comprising: a current switch; a level-shift circuit for shifting the output level of said current switch; and a CMOS circuit adapted to be operated by the output of said level-shift circuit, wherein the improvement comprises: a level-shift circuit for generating a first output with a small level-shift and a second output with a larger level-shift than said first output; a CMOS circuit including a PMOS transistor having its gate fed with said first output, and an nMOS transistor having its gate fed with said second output; and a current switch for giving output levels to turn on said PMOS transistor and off said nMOS transistor at its high level and to turn on said PMOS transistor and off said nMOS transistor at its low level.

BRIEF DESCRIPTION OF THE DRAWINGS

FIG. 1 is a circuit diagram showing a level converter circuit to be compared with the present invention;

FIG. 2 is a circuit diagram showing a level converter circuit according to one embodiment of the present invention;

FIGS. 3A to 3F are circuit diagrams showing alternative arrangements for the input level-shift circuit and the current source of FIG. 2;

DESCRIPTION OF THE PREFERRED EMBODIMENT

Figure 4:
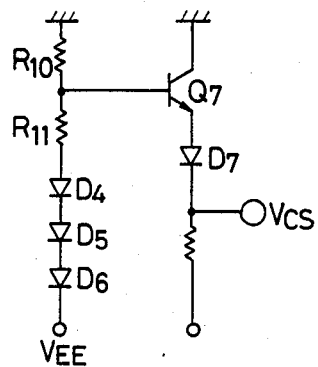
FIG. 4 is a circuit diagram showing a base voltage generator for a current source of the current switch of FIG. 2.

Before the present invention is described in detail in the following in connection with the embodiments thereof, one level converter circuit to be compared will be described.

Example for Comparison

In case an ECL circuit of composed bipolar transistors and a CMOS circuit are used in combination, the structure shown in FIG. 1 can be conceived as a converter circuit of two circuit levels.

In FIG. 1, letters $Q_1$, $D_1$ and $D_2$ indicate a bipolar transistor and junction diodes for effecting a level shift to shift an input signal level to a level as close to $V_{EE}$ as possible (wherein a power supply voltage $v_{CC}$ is set at the ground level in the example of FIG. 1). For this level shift, the transistor and the diodes may be either replaced by or combined with a resistor. The signal having its level shifted is inputted to a current switch composed of transistors $Q_2$ and $Q_3$ and resistors $R_2$, $R_3$ and $R_4$. This current switch is so designed that its output signal may have an amplitude as large as possible. The output signal of the current switch is applied through an emitter-follower, which is composed of a transistor $Q_4$ and a resistor $R_5$, to the input of a CMOS inverter which is composed of a PMOS transistor M1 and an nMOS transistor M2.

In this case, a practical circuit has to be so designed that it can operate even with fluctuations of 10% in the power supply voltage $V_{EE}$ and fluctuations of 0° to 100° C. in a junction temperature $T_j$. In order to design the transistors $Q_2$ and $Q_3$ so that they may not be saturated even with such fluctuations, it is impossible to set the output amplitude of the current switch at such a high level. This makes it impossible to turn off especially the transistor M2 of the CMOS inverter completely for the aforementioned fluctuations. Since the CMOS inverter does not have a very high gain, moreover, any one-stage inverter would find it impossible to set the output level at $V_{CC}$ and $V_{EE}$. Therefore, a plurality of stages of inverters have to be connected in series for use, as shown in FIG. 1. With this plural-stage structure, however, the MOS transistors are not turned off completely. As a result, a substantial flow of dc current is caused to augment the power consumption and to elongate the delay time because of the multistage connection.

FIG. 2 is a circuit diagram showing the level converter circuit according to one embodiment of the present invention.

In FIG. 2, a circuit composed of the transistor $Q_1$, the diode $D_1$ and a constant current source $I_1$ is an input level shift circuit like FIG. 1. This input level-shift circuit per se has no direct relationship with the gist of the present invention, but the diode $D_1$ of FIG. 2 can be replaced a variety of circuits shown in FIG. 3. Incidentally, a plurality of diodes $D_1$ may be provided, if necessary. As shown in FIG. 3A, more specifically, the replacing circuit may be constructed of either a resistor $R_6$ only or this resistor $R_6$ and a speedup capacitor $C_1$ connected in parallel with the former, as shown by a broken line. As shown in FIG. 3B, moreover, the circuit may be a series circuit of the resistor $R_6$ and the diode $D_1$, and two or more diodes $D_1$ may be connected in this case. As shown in FIG. 3C, the diode $D_1$ and the resistor $R_6$ may be replaced by a circuit which divides the collector-emitter of the transistor $Q_4$ by resistors $R_7$ and $R_8$ to apply a base voltage and with which the speedup capacitor $C_1$ shown by a broken line may be connected in parallel. In this case, it is possible to generate a voltage an arbitrary constant (1 or more) times as high as the base-emitter forward voltage $V_{BE}$ of the transistor $Q_4$. With the circuit of FIG. 3C, moreover, there can be connected in series a necessary number of diodes $D_1$, although not shown, and these diodes $D_1$ may be connected with the emitter of the transistor $Q_4$ whereas a resistor may be connected between the other terminals and bases of the diodes $D_1$. Next, the constant current source $I_1$ of the input level-shift circuit may be exemplified by any circuit such as only a resistor or a circuit in which the resistor $R_7$ is connected with the transistor $Q_1$, as shown in FIG. 3D. Moreover, the constant current source $I_1$ may be exemplified by the circuit of FIG. 3E, which is known as the "current mirror". Still moreover, the current source may be exemplified by a MOS transistor $M_7$, as shown in FIG. 3F. A gate voltage may be exemplified by either a method of applying the same voltage as that of the drain, i.e., a circuit having the gate and drain connected or by a suitable voltage such as $V_{CC}$.

In the present invention, even with the fluctuations in the power source voltage or the like, no dc current flows through the CMOS circuit shown in FIG. 2, and the multistage inverter can be dispensed with. Therefore, the gates of the PMOS transistor M1 and the nMOS transistor M@ are not driven by the identical voltage, but the PMOS transistor M1 is fed, when turned off, with a constant gate drive voltage from the $V_{CC}$ whereas the nMOS transistor M2 is fed, when turned off, with a constant gate drive voltage from the $V_{EE}$. This makes it possible to generate the complete CMOS level and to completely prevent the dc current in the steady state by the one stage of the CMOS inverter.

The basic circuit of the present invention is realized by the current switch composed of the transistors $Q_2$, $Q_3$ and $Q_6$, the level shifting emitter-follower composed of the transistor $Q_4$ and so on, and the CMOS inverter composed of the transistors M1 and M2.

In the present embodiment, in order to ensure that no dc current will flow in the steady state through the CMOS inverter even with the fluctuations in the power source voltages $V_{CC}$ and $V_{EE}$, the temperature and so on, the signals levels (e.g., the high and low levels) at points P and Q are set, as follows.

First of all, the high level at the point P is expressed by $(V_{CC}-V_{BE})$ if the base-emitter voltage of the bipolar transistor is set at $V_{BE}$. As a result, a practically negligible dc current will flow if the threshold voltage $V_{TH}$ of the PMOS transistor M1 is set at about $V_{BE}$ or higher (e.g., $-0.5$ to $-0.6$ V).

Next, if the low level at the point Q can be set at $(V_{EE}+(0 \text{ to } V_{BE}))$, the nMOS transistor M2 can be turned off so that no dc current flows.

As is apparent from the set value of the voltage level, the high level at the point P is determined exclusively by $V_{CC}$ and $V_{BE}$ so that the PMOS transistor M1 can be turned off even with the fluctuations in the $V_{CC}$ and the temperature when the point P is at the high level. When the point P is at the low level, on the other hand, a signal amplitude sufficient for turning on the transistor M1 is necessary, but this design can be made, as will be described hereinafter. Since the low level at the point Q is determined exclusively by the $V_{EE}$ and $V_{BE}$, the nMOS transistor M2 is turned off even with the fluctuations in the $V_{EE}$ and the temperature when the point Q is at the low level, so that no dc current will flow in a steady manner. When the point Q is at the high level, on the other hand, it is necessary to sufficiently turn on the transistor M2, and this necessity can also be satisfied, as will be described hereinafter.

The signal levels at the points P and Q are generated, as described above, and the bipolar transistor $Q_4$ is operated without any saturation within a normalized range (usually $\pm 10\%$) of the desired power source voltage.

For this operation, the following state is held in the present invention.

First (i): since the high level of the base voltage of the emitter-follower transistor $Q_4$ is almost at the $V_{CC}$ (at 0 V, as shown in FIG. 2), the high level at the point P automatically satisfies the aforementioned condition, i.e., the condition under which the PMOS transistor M1 is turned off. Next (ii): in order that the low level at the point Q may always be expressed by $(V_{EE}+V_{BE})$, for example, it is sufficient that the low level of the base voltage of the transistor $Q_4$ could be expressed by $(V_{EE}+nV_{BE}$ (wherein n designates an integer equal to or larger than 2)). Incidentally, in the case of FIG. 2, the factor n appearing in the above expression is 3, but this factor can be increased to $n \geq 4$ by connecting a plurality of diode-connection transistors $Q_6$ in series, as is different from the case in which there is no series-connected transistor $Q_6$.

In order to set the base voltage of the transistor $Q_4$ at $(V_{EE}+nV_{BE})$, the following equation holds for the current switch of FIG. 2 if the ratio of the resistors $R_4$ and $R_2$ is designated at $\gamma$:

$$-\gamma(V_{CS} - V_{BE} - V_{EE}) = \text{Low Collector Level of } Q_3$$

$$= V_{EE} + nV_{BE}.$$

Hence, the voltage $V_{CS}$ may be expressed by the following equation:

$$V_{CS}=(1-1/\gamma)V_{EE}+(1-n/\gamma)V_{BE} \tag{1}$$

Here, $h_{FE}=\infty$ is assumed for calculating the foregoing equations. Since the $h_{FE}$ is not infinite in fact, however, there arises a discrepancy between the value $V_{CS}$ the above-specified equation (1), but this discrepancy is very small because the value $h_{FE}$ generally takes a very large value. For a small value of the $h_{FE}$, on the other hand, a correction is required although slightly.

Incidentally, if the $V_{CS}$ power source takes such a voltage between the $V_{CC}$ (which is assumed to be at 0 V) and the $V_{EE}$ as can be practically generated, any combined voltage of the $V_{EE}$ and the $V_{BE}$ can be generated. In FIG. 2, for example, the foregoing equation (1) takes the following value for $n=3$ and $\gamma=5$:

$$V_{CS}=4/5 \cdot V_{EE} \text{ and } +2/5 \cdot V_{BE} \tag{2}$$

The voltage of the above equation (2) can be generated by the circuit shown in FIG. 4, for example. In FIG. 4, the resistance ratio of resistors R10 and R11 is expressed by R10: R11=4:1.

For other values $\gamma$ and n, the power source $V_{CS}$ can be prepared by likewise combining a transistor $Q_7$, diodes $D_4$ to $D_7$ and the resistors R10 and R11.

The voltage level at the point P in this case is expressed by the following equations:

$$\text{High Level at Point } P = -V_{BE} \tag{3}$$

and $$\text{Low Level at Point } P = V_{EE} + (n-1)V_{BE} \tag{4}$$
$$= V_{EE} + 2V_{BE}.$$

Likewise, the voltage level at the point Q is expressed by the following equations:

$$\text{High Level at Point } Q = -(n-1)V_{BE} = -2V_{BE} \tag{5}$$

and $$\text{Low Level at Point } Q = V_{EE} + V_{BE} \tag{6}$$

The values n and $\gamma$ should be determined upon the actual design while considering the conditions such as the complicatedness of the structures of the input level-shift circuit and a reference voltage $V_{BB}$ generator, that the transistors $Q_2$, $Q_3$ and $Q_4$ composing the current switch are not saturated within the standards of the $V_{EE}$, temperature and so on, and that the signal amplitudes at the points P and Q are enlarged as much as possible.

Figure 5:
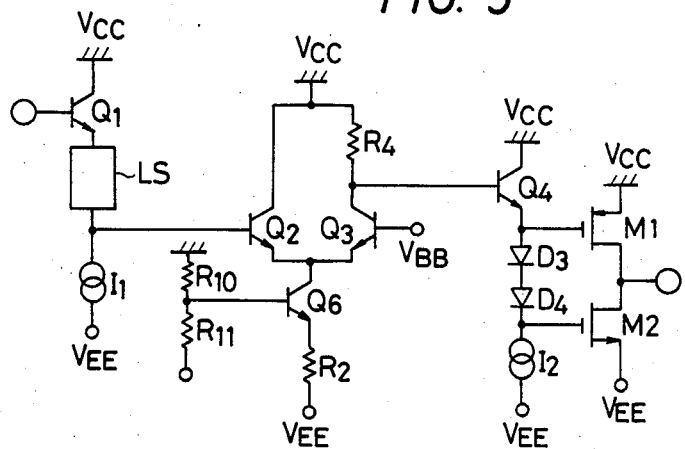
FIG. 5 is a circuit diagram showing a level converter circuit according to another embodiment of the present invention.

As another example of the values n and $\gamma$ different from those of FIG. 2, an embodiment for n=4 and $\gamma=4$ is shown in FIG. 5. In this case, the voltage $V_{CS}$ takes the following value from the foregoing equation (1):

$$V_{CS} = \mu \cdot V_{EE} \tag{7}$$

Hence, the $V_{CS}$ may be so simplified as is shown in FIG. 5. Here, in the drawing, $R_4/R_2=4$, and R10/R11=3. Moreover, the input level-shift circuit LS can be selected arbitrarily from the structures shown in FIGS. 2 or 3.

Figures 6A, 6B, 6C, 6D:
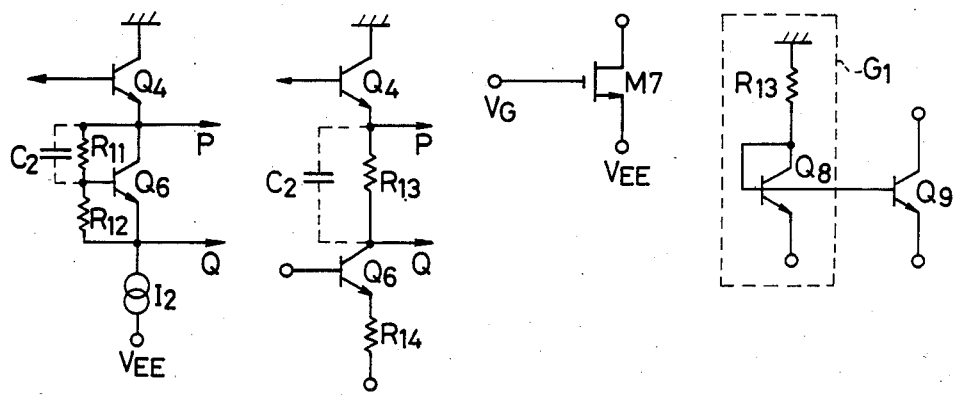
FIGS. 6A to 6D are circuit diagrams showing respective embodiments of the level-shift circuit.

Incidentally, in FIG. 2, there is shown the levelshift circuit which is composed of the transistor $Q_4$, a diode $D_3$ and the current source $I_2$ but which can be modified in various manners. For n=4, for example, the two diodes $D_3$ and $D_4$ may be connected in series. For the value n other than an integer, moreover, the voltage $V_{BE}$ can be level-shifted in an arbitrary multiplication if a circuit shown in FIG. 6A, for example, is used. On the other hand, the level-shift circuit can be composed of only resistors $R_{13}$ and $R_{14}$, as shown in FIG. 6B.

Incidentally, in this case, it is necessary to apply the voltage of ($V_{EE}+V_{BE}$(wherein m designates a constant such as 1.5)) to the base of the current source transistor $Q_6$. Moreover. the low level at the point Q can be selected to have various values other than the value ($V_{EE}+mV_{BE}$). For example, the low level can take a value expressed by ($V_{EE}+\alpha V_{EE}$(wherein $0 \leq \gamma <1$)), for example. In this case, as shown in FIG. 2, the low level of the collector voltage of the transistor $Q_3$ is designed to take a value expressed by ($V_{EE}+(2+)V_{BE}$). With this voltage level set, the amplitude of the voltage for driving the gate of the PMOS transistor M1 can be enlarged to effect a high-speed operation. Moreover, the low level at the point Q can be set at ($0.95V_{EE}+0.5$), for example.

In short, these values may suffice the condition the nMOS transistor M2 is not turned on within the fluctuation allowable ranges of the power source voltage $V_{EE}$, the temperature and so on. In this case, it is necessary to avoid the use of the type shown in FIG. 6B as a current source $I_2$, because the transistor Q6 is saturated. At this time, the current source $I_2$ may be exemplified by a resistor only, by the MOS current source ($M_7$) shown in FIG. 6C or by a current source ($Q_8$ and $Q_9$) using the Miller circuit shown in FIG. 6D. Incidentally, a circuit enclosed by a broken block G1 in FIG. 6D is the circuit for generating the base voltage of the transistor $Q_9$ of the Miller current source and is generally used commonly for a plurality of current sources.

In the embodiments thus far described, incidentally, the shift of the level-shift circuit is set at $nV_{BE}$. Accepting the complicated design, it is not impossible to set the low level at the point Q at a desired value by the level shift of $\alpha V_{EE}+\beta V_{BE}$. Even in case the low level at the point Q is other than the value ($V_{EE}+V_{BE}$) whereas the level shift is other than $nV_{BE}$, it is possible according to the same procedures to construct the circuit for generating a desired value as the base voltage $V_{CS}$ of the current source ($Q_6$) of the current switch by calculating the value necessary for the base voltage of the transistor $Q_4$ like FIG. 2.

In the embodiments thus far described, the current switch and its current source and level-shift circuit are composed of the bipolar transistors but can likewise be constructed by using MOS transistors. For handling a small-amplitude signal, however, the bipolar transistors can be the more advantageously used because the base-emitter voltage $V_{BE}$ has the smaller dispersion than the threshold voltage $V_{TH}$.

The embodiment shown in FIG. 2 is directed to the circuit for converting either the ECL input from the outside of the chip into the CMOS level necessary for the chip inside or outside or the ECL level inside the chip into the CMOS level necessary for the chip inside or outside.

Figure 7:
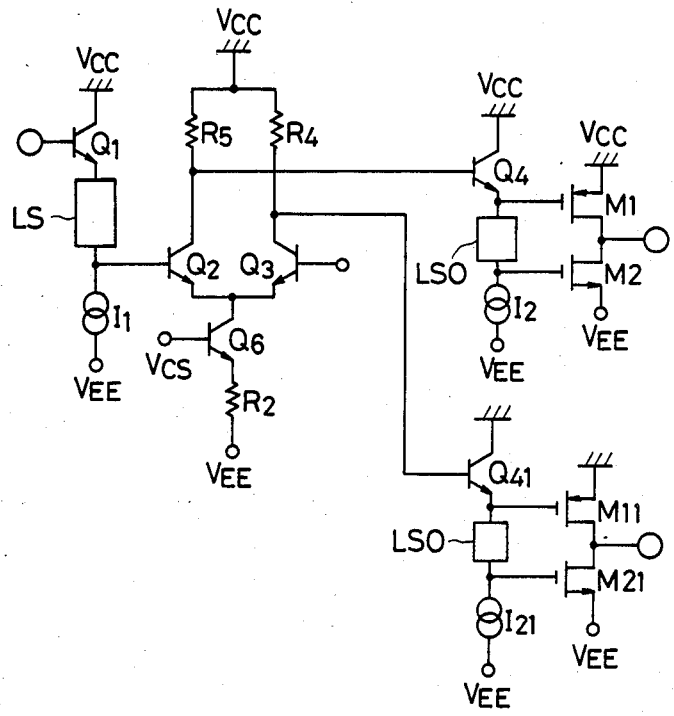
FIGS. 7, 8 and 9 are circuit diagrams showing level converter circuits according to other embodiments of the present invention, respectively.

An example of the application of the above-specified circuit is a memory LSI which has its inside composed of the CMOS transistors for setting only the input and output at the ECL level. This example is required to have an inverted output and a non-inverted output as the buffer outputs. This requirement can be satisfied, for example, by adding the CMOS inverter to the downstream stage of the output of the circuit of FIG. 2 and by generating an inverted output. Then, this inverted output is delayed by one stage so that the symmetry between the inverted and non-inverted outputs is lost. As shown in FIG. 7, therefore, both the inverted and non-inverted outputs of the current switch may be converted into the CMOS level. In the Figures subsequent to FIG. 7, incidentally, letters LSO may be exemplified by any of the level-shift circuits shown in FIGS. 2, 5, and 6A to 6D. In case the output has a high capacitive load, on the other hand, there may be added to the output of the circuit of FIG. 2 a buffer circuit in which the bipolar transistor having a high load drivability and the CMOS are combined.

Figure 8:
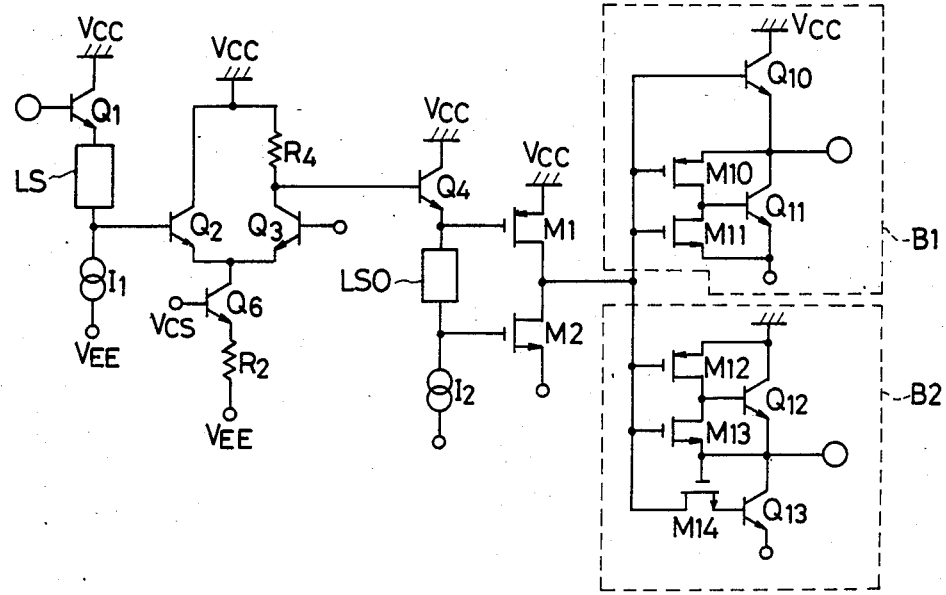

FIG. 8 is a circuit diagram showing the structure in case the buffer circuit is added to the output of the circuit of FIG. 2.

An affirmative buffer B1 and a negative buffer B2 are added to the output of the circuit of FIG. 2. A high capacitive load can be charged or discharged at a high-speed by that circuit. It goes without saying that any circuit may be used as a complex buffer circuit of the bipolar transistors and the CMOS.

The circuit of FIG. 8 is of the type in which the output is fed through the complex buffers B1 and B2 of the bipolar transistors and the CMOS once it is converted into a complete CMOS level. As a result, bipolar transistors $Q_{10}$ to $Q_{13}$ are driven through the two-stage CMOS circuit.

Figure 9:
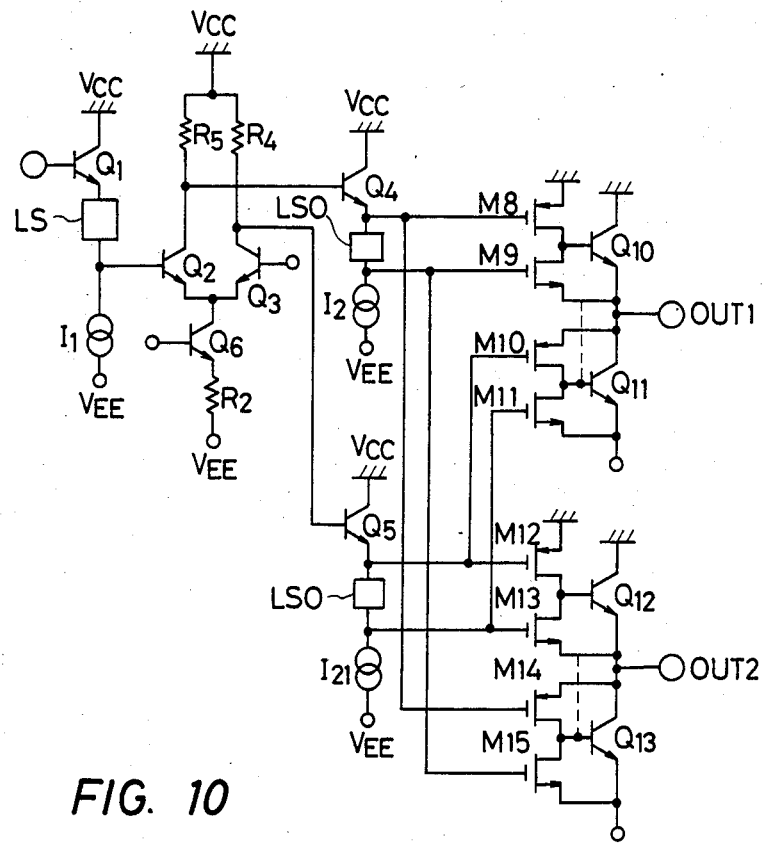

FIG. 9 shows a circuit which is so improved from that of FIG. 8 that complementary outputs (of which one is at the high level whereas the other is at the low level) are extracted from the two collectors of the current switch. By these complementary outputs, the CMOS inverter, which is connected with the respective bases of the upper transistors $Q_{10}$ and $Q_{11}$ and the lower transistors $Q_{12}$ and $Q_{13}$ of the totem-pole connection, is controlled so that the one-side transistors of the totem-pole connection are turned on whereas the other are turned off. When the input is at the high level, for example, an output OUT1 takes the high level (i.e., the transistor $Q_{10}$ is turned on whereas the transistor $Q_{11}$ is turned off), but an output OUT2 takes the low level (i.e., the transistor $Q_{12}$ is turned off whereas the transistor $Q_{13}$ is turned on). In case the outputs OUT1 and OUT2 are loaded only by the capacitive load, no steady current flows through the complex circuit of the bipolar transistors and the CMOS when the load is charged to the high level or discharged to the low level. An nMOS transistor M9 connected with the base of the upper bipolar transistor $Q_{10}$ of the totem-pole connection has its source connected with the output OUT1, but has its connection changed to the base of the lower transistor $Q_{11}$, as shown by a broken line.

With this constructed, the charge stored in the base or the like of the upper transistor $Q_{10}$ is extracted by the nMOS inverter and fed as the base current of the lower transistor $Q_{11}$ so that the ON time of the lower transistor $Q_{11}$ can be shortened.

Figure 10:
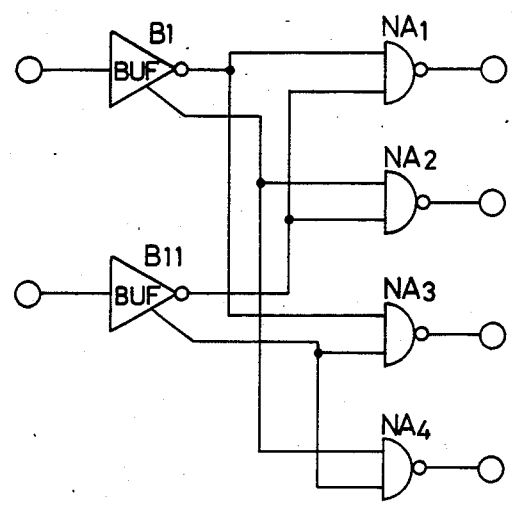
FIG. 10 is a circuit diagram showing a decoder circuit used in FIGS. 7 to 9.

FIG. 10 is a diagram showing the logic structure of a decoder circuit using the buffer circuits of FIGS. 7 to 9.

In FIG. 10, two-input NAND circuits $NA_1$ to $NA_4$ may be exemplified by the NAND circuit of CMOS type or by the gate (which should be referred to Japanese Pat. Application No. 57-135142 or 57-135143) which is constructed by combining the bipolar transistors and the CMOS. In case the number of input addresses is more, it is sufficient to increase the number of the inputs of the NAND gates or to construct the gate circuit of two stages of which the first one conducts a partial decoding like the output of FIG. 10 so that the second-stage decoder may be driven by that output.

Incidentally, if the emitter-follower is contained in the level-shift circuit, as shown in FIG. 2, an advantage can be attained for a high-speed operation, and the emitter follower can be effectively used in the decoding case.

Figure 11:
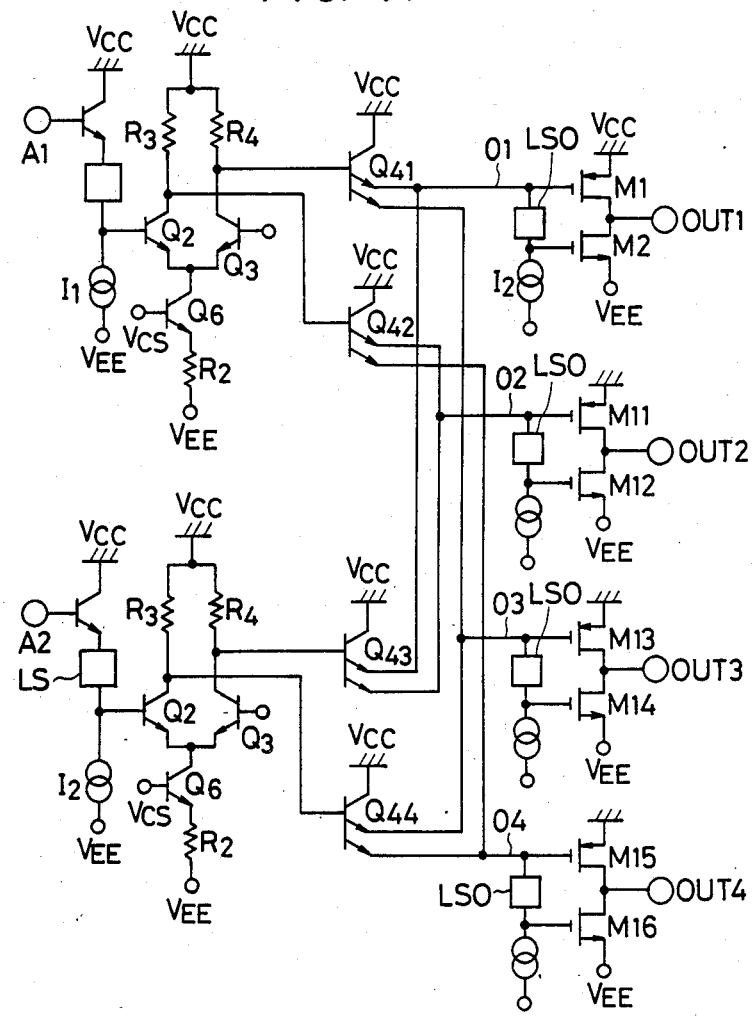
FIG. 11 is a circuit diagram showing a decoder circuit according to another embodiment of the present invention.

FIG. 11 is a circuit diagram showing another embodiment using the emitter-follower of FIG. 2.

In this embodiment, the outputs taken out from both the collectors of the current switch are wired "OR" through the emitter-follower of double-emitter transistors $Q_{41}$ to $Q_{44}$. These double-emitter transistors $Q_{41}$ to $Q_{44}$ may naturally be exemplified by two independent transistors. In accordance with the states of inputs A1 and A2, one of wired ORs 01 to 04 takes the high level whereas the remaining three take the low level. The output of this emitter-follower is outputted as the CMOS level through the level-shift circuit LSO of the diodes and through the CMOS buffer so that one of the outputs OUT1 to OUT3 takes the high level whereas the remainder takes the low level.

Here, if the ratio Y of the resistors $R_3$, $R_4$ and $R_2$ is set and if the control voltage $V_{CS}$ is set according to the foregoing equation (1) in a manner to correspond to the shift n of the level-shift circuit, as in the case of FIG. 2, no dc current in the steady state can be made to flow through the CMOS inverter even with the changes in the power source voltage $V_{EE}$ and the temperature. At this time, the output completely takes the CMOS level. On the other hand, the load to be driven by the outputs OUT1 and so on may be driven, when it is high, through the complex buffer circuits B1 and B2 of the bipolar transistors and the CMOS, as shown in FIG. 8.

In case the number of the inputs is further increased in the decoder of FIG. 11, it is sufficient to increase the number of the wired ORs. For three inputs, for example, the double emitter can be replaced by a transistor having four emitters so that eight decoded outputs can be generated by conducting the "wired OR". In case the number of the inputs is further increased, it is necessary to conduct the partial decoding by the circuit of FIG. 11 and further the full decoding by adding a second-stage decoder.

Figure 12:
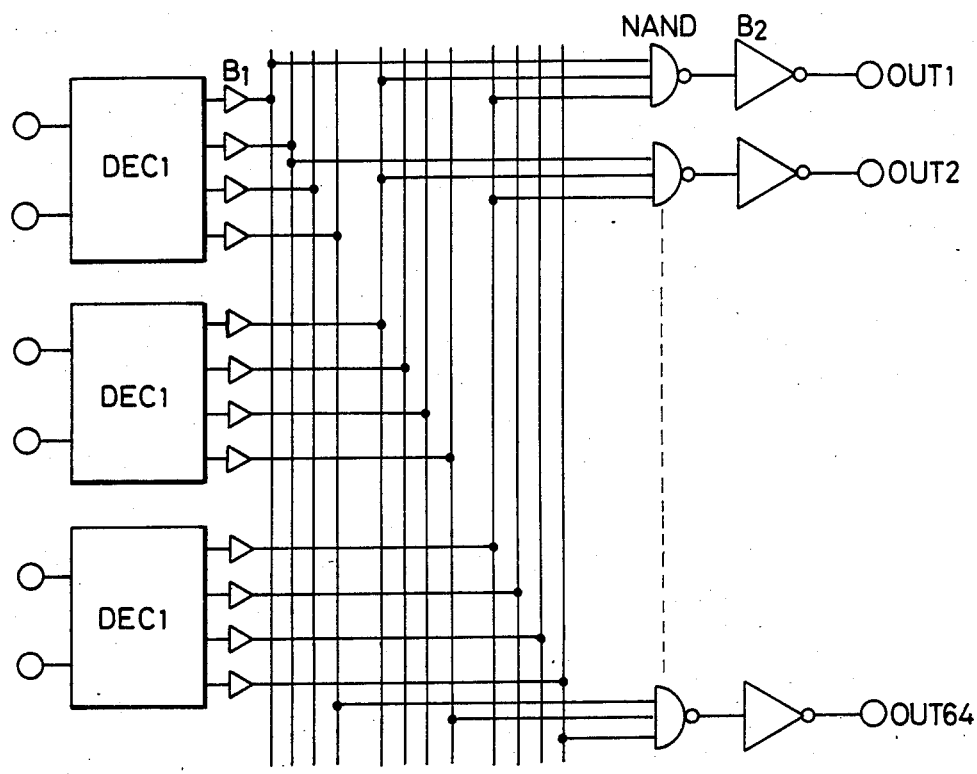
FIG. 12 is a circuit diagram showing an embodiment of the decoder circuit in which a number of gate circuits are added to the decoder of FIGS. 10 to 11.

FIG. 12 is a diagram showing the construction of a decoder for the full decoding.

In FIG. 12, sixty four decoded outputs can be generated by six inputs. Indicated at letters DEC1 is a decoder which is shown in FIG. 11 and the output of which has the complex buffer B1 of the bipolar transistors and the CMOS added thereto. The three decoders DEC1 are applied to the respective inputs of the three-input NAND circuit (which is exemplified by the CMOS gate) so that only one of the NAND outputs takes the low level for the sixty four combinations of $4^3$ whereas all the remaining NAND outputs take the high level.

In FIG. 12, it is assumed that it is necessary to set one of the sixty four decoder outputs OUT1 to OUT64 at the high level but all the remaining outputs at the low level and to drive the heavy capacitive load. Therefore, the complex inverter B2 (e.g., the buffer circuit B2 shown in FIG. 8) of the bipolar transistors and the CMOS is connected with the downstream stage of the output of the NAND circuit thereby to invert the signal and to increase the drivability. In case the input number is further increased more than that of the case of FIG. 12, the input number of the decoders DCE1 may be three, or the number of the circuits DEC1 may be increased to four to accordingly increased the input number of the NAND gates to four.

Although a few examples of the decoders have been described hereinbefore, non-inverter-type and inverter type circuits can be used as the complex buffer circuits B1 and B2 in case the decoders similar to that of FIG. 12 are to be constructed including the case in which the desired selection level is at the low level, for example, so that the NAND and the NOR can be used as the CMOS gate, and the complex gate circuit of the various bipolar transistors and the CMOS can be used as the gate circuit. As a result, the decoder of a proper combination can be constructed in accordance with the weight of the load, the desired polarity of the decoder output, and the number of the inputs.

The embodiments thus far described have the circuit type, in which the currents are always made to flow through the current switch and the emitter-follower of the buffer circuit even when the chip is not selected (or when the chip select signal $\overline{CE}$ takes the high level). In order to reduce the power consumption for the non-selection, however, those currents can be cut upon the non-selection. In the buffer-decoder circuit of FIG. 11, for example, all the three kinds of current sources, i.e., the current source $I_1$ of the level-shift circuit at the input terminal, the current source (which is composed of $Q_6$ and $R_2$) of the current switch, and the current source $I_2$ of the level-shift circuit (i.e., the emitter-follower $Q_{41}$ to $Q_{44}$) may be cut. For example, the current source $I_1$ and the current source of the current switch are of the type composed of the transistor $Q_5$ and the resistor $R_7$, as shown in FIG. 3D, whereas the current source $I_2$ is of the type composed of only the transistor $Q_5$, as shown in FIG. 3E. In order to turn on or off a current source, therefore, a MOS transistor may be connected between the base of the current source transistor $Q_5$ and that current source to control the gate of the same with the $\overline{CE}$ signal so that no current may flow upon the non-selection. Upon this non-selection in this case, all the outputs of FIG. 11 take the low level, whereas all the decoder outputs of FIG. 12 take the low level to come into the non-selected state.

The description thus far made is directed to the case in which the circuit of the present invention is used as the input circuit of an LSI. However, the present invention can be applied to the case in which the major signals of an internal circuit are at the ECL level so that they may be converted as the output signal to take the CMOS level or the TTL level.

First of all, the circuit shown in FIG. 2 or 5 can be used without any modification as the output conversion level from the ECL to CMOS levels.

Figure 13:
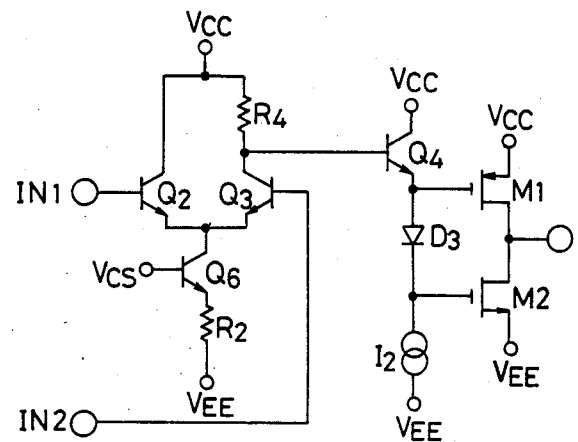
FIGS. 13 to 22 are circuit diagrams showing respective examples of the applications of the output converter circuit according to the present invention.

FIG. 13 is a circuit diagram showing the case in which the circuit of FIG. 2 or 5 is used as the circuit for the conversion of ECL→CMOS levels.

In case an input signal IN1 is generated in the internal circuit, generally speaking, it is very easy to set that level at a desired value. Therefore, the level-shift circuit of the input signal is not shown in FIG. 13. Since it is relatively easy to generate a differential signal from the aforementioned input signal IN1 as another input signal IN2, moreover, the signals IN1 and IN2 are used as the differential input signals in FIG. 13. In case no differential signal is generated, the signal may naturally be set at the suitable constant voltage $V_{BB}$. On the other hand, the control voltage $V_{CS}$ is designed in accordance with the foregoing equation (1).

Figure 14:
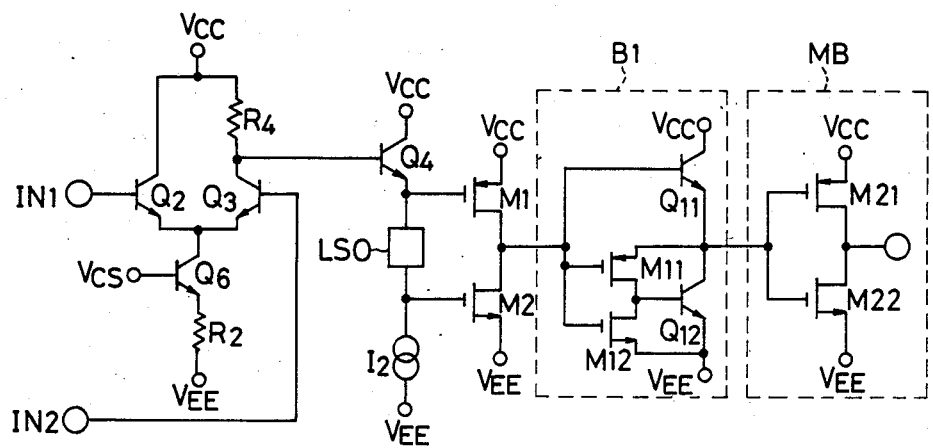

Incidentally, in case this converter circuit is an output circuit for feeding its output to the outside of the chip, a heavy (ac or dc) load is frequently connected with that output. At this time, a high drivability is required as the output to make it necessary to use a transistor having a large gate width as the MOS transistor of FIG. 13. In this case, the stray capacitance accompanying the MOS transistor becomes so large as to make it necessary to increase the currents of the current switch and the emitter-follower to considerable large values. In case it is necessary to avoid this increase of current, an amplifier may be added to the downstream stage of the output, for example, as shown in FIG. 14. Here, letters B1 indicate a combined buffer of the bipolar transistors and the CMOS, and letters MB indicate the output MOS having a desired gate width. The buffer B1 may be exemplified by either the buffer circuit B2 shown in FIG. 8 or another combined buffer.

In case the output is not required to have the complete CMOS level, on the other hand, the output MOS circuit MB may be omitted. In this case, the output has a high level expressed generally by $(V_{CC}-V_{BE})$ and a low level expressed generally by $(V_{EE}+V_{BE})$ In case the MOS circuit MB can be driven without the combined buffer B1, moreover, the buffer B1 may be omitted to drive the circuit MB directly by the output of the circuit of FIG. 13.

Next, three states, i.e., a high-impedance state in addition to the high level and the low level may be required as the output level. One embodiment in this case is shown in FIG. 15.

Figure 15:
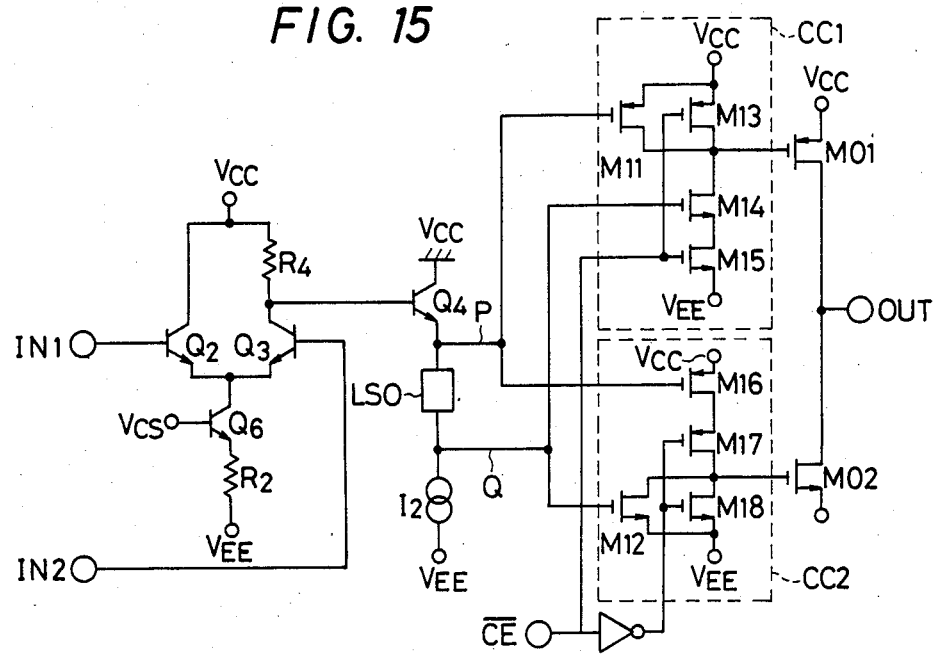

In FIG. 15, an outputting PMOS transistor MO1 and an outputting nMOS transistor M02 are equipped with separate gate control circuits CC1 and CC2. The output at the point P of the emitter-follower is connected with the gate of the PMOS transistors of the circuits CC1 and CC2, whereas the output at the point Q is connected with the gate of the nMOS transistor. In order to realize the high-impedance state, moreover, the gate control circuits CC1 and CC2 are made to have the shown gate structure so that the output signals to the gates of the transistors MO1 and M02 may be held at the high and low levels, respectively, irrespective of the signal from the emitter-follower when the signal $\overline{CE}$ is at the high level. When the signal $\overline{CE}$ takes the low level, the signal corresponding to the signal from the emitter-follower appears at an output terminal OUT.

In the description thus far made, it is conceived to completely generate the output at the CMOS level. As is well known in the art, however, the PMOS transistor has a lower transconductance gm than the nMOS transistor. As a result, a high-speed operation can be attained with a small area if the PMOS transistor is replaced by the nMOS or bipolar transistor.

Figure 16:
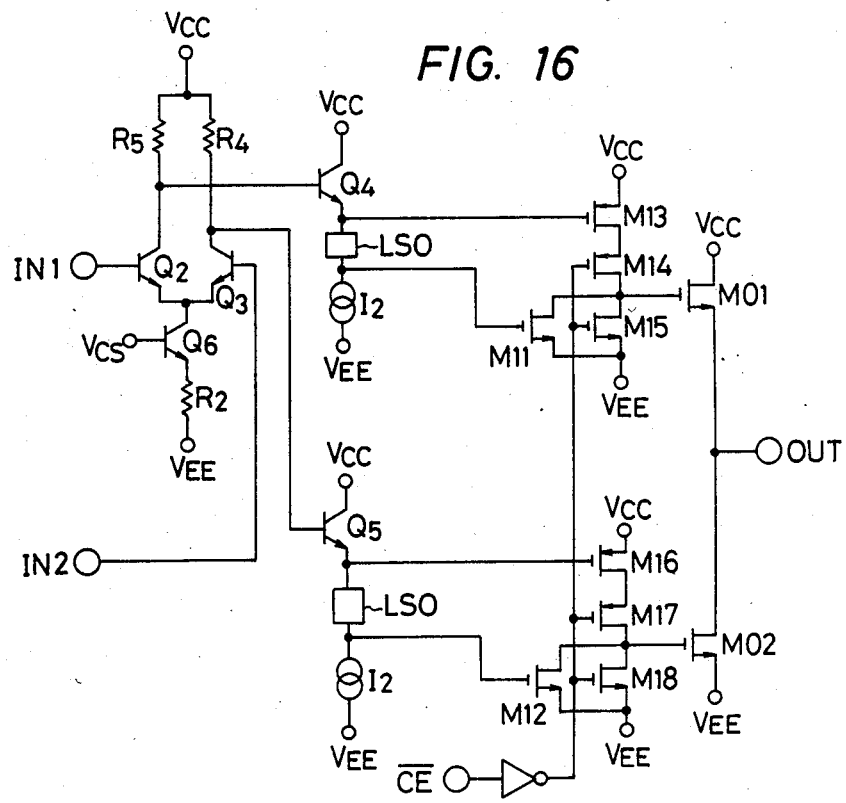

FIG. 16 is a circuit diagram showing an example in which the PMOS transistors at the output stage are replaced by the nMOS transistors.

In this case, too, the output takes the high-impedance state (in which both the output MOS transistors MO1 and M02 are turned off) if the signal $\overline{CE}$ takes the high level.

In FIG. 16, both the two input gates are exemplified by the NOR circuits. Since the PMOS transistors have a lower transconductance gm for the same size than the nMOS transistors, it is well known that a higher speed can be generally achieved by using the NAND as the gate.

Figure 17A:
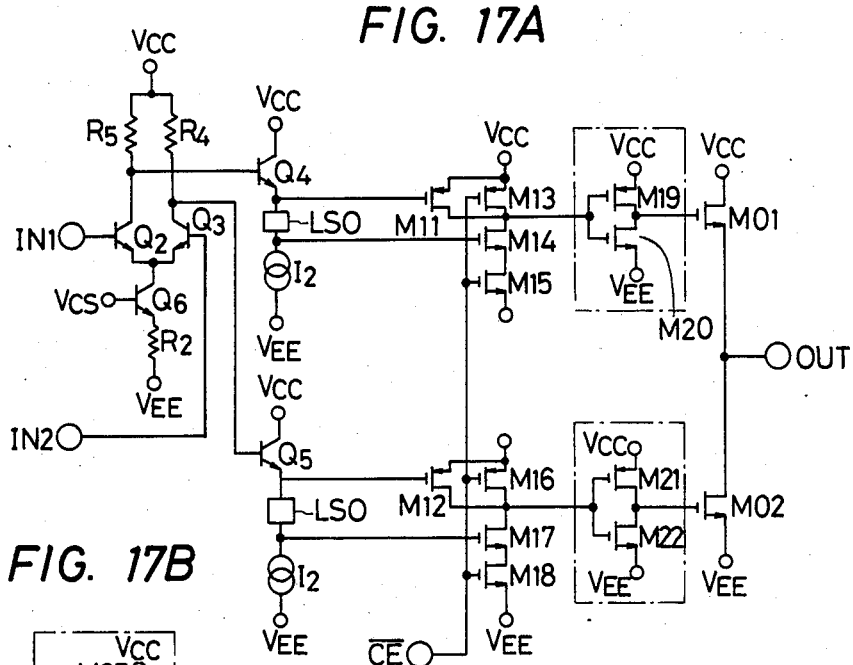

FIG. 17A is a circuit diagram showing another example having the same function realized by using not the NOR gates in FIG. 16 but the NAND gate and the inverter.

This structure can also be applied similarly to the NOR gate of FIG. 15.

Figure 17B:
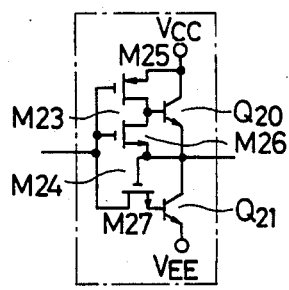
Figure 18:
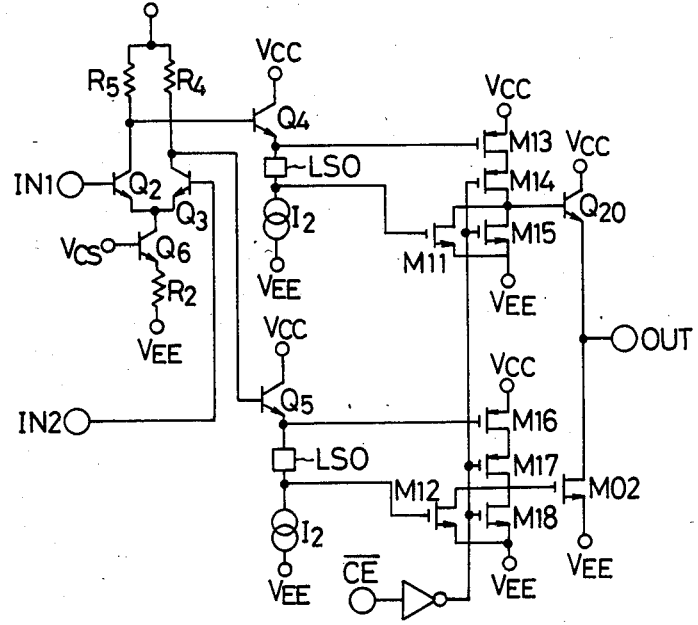

The same structure can also be taken in the NOR gate of the embodiments subsequent to FIG. 18. Moreover, the CMOS inverter enclosed by dotted lines of FIG. 17A may be replaced by the combined inverter which is composed of bipolar transistors and the CMOS, as enclosed by dotted lines of FIG. 17B. In case the load to be driven is heavy, the high speed can be attained by using the combined inverter.

FIG. 18 is a circuit diagram showing another modification of the present invention, in which the upper MOS transistor of the output stage totem-pole is replaced by an npn transistor.

If a bipolar transistor $Q_{20}$ is used, a higher transconductance gm can be achieved even with the smaller size than the MOS transistor thereby to ensure the high speed.

Incidentally, in FIG. 18, the MOS transistor having a considerable gate width has to be used for driving the final-stage npn transistor $Q_{20}$ and the nMOS transistor M02 with the CMOS gate (or the CMOS inverter). In this case, the bipolar transistor or the combined buffer of the bipolar transistors and the CMOS may be connected between the CMOS gate the final output stage transistor $Q_{20}$ M02.

Figure 19:
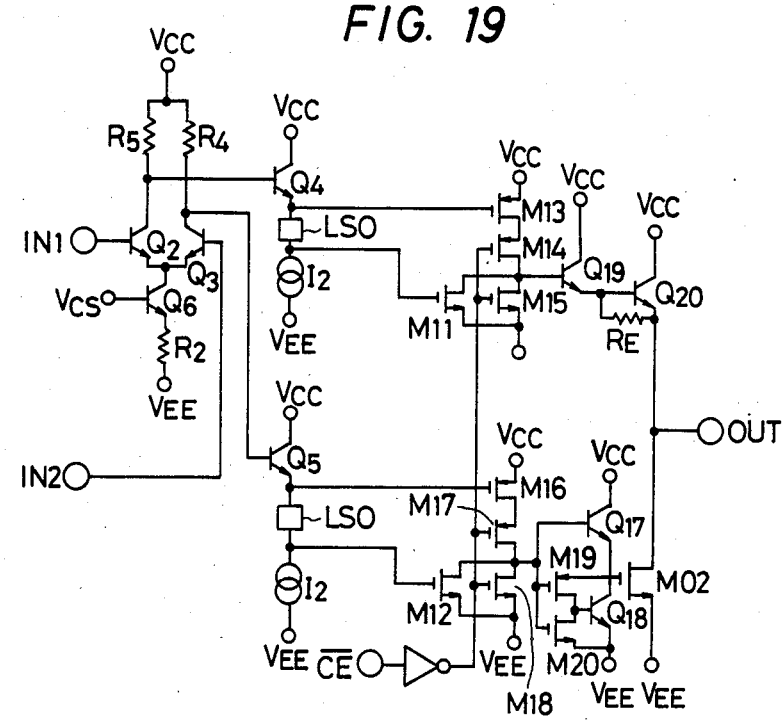

FIG. 19 is a circuit diagram showing another example in which a buffer is inserted to the upstream of the final output stage of the circuit of FIG. 18.

The emitter-follower of an npn transistor $Q_{19}$ is inserted into the upstream of the final stage npn transistor $Q_{20}$ to construct the Darlington emitter-follower. This structure is effective not only for ensuring the high speed but also for generating a breakdown voltage of 2, as viewed from the output terminal, when the EB breakdown voltage ($BV_{EBO}$) of the npn transistor $Q_{20}$ is lower than the power source voltage. Into the upstream of the nMOS transistor M02, moreover, there is inserted the combined buffer (or non-inverter) composed of the bipolar transistors and the CMOS.

The circuit of FIG. 19 is equipped with only a resistor $R_E$ as means for sweeping out the stored charge from the base of the final output stage npn transistor $Q_{20}$ in case the output comes into the high-impedance state. As a result, in case a number of output stages are connected commonly, there arises a possibility that the breakdown response of the node (or output) is remarkably delayed. For that possibility, there is a method by which the output npn transistor of each output circuit has its base equipped with discharge means for discharging the stored charge thereby to effect the high-speed operation.

Figure 20:
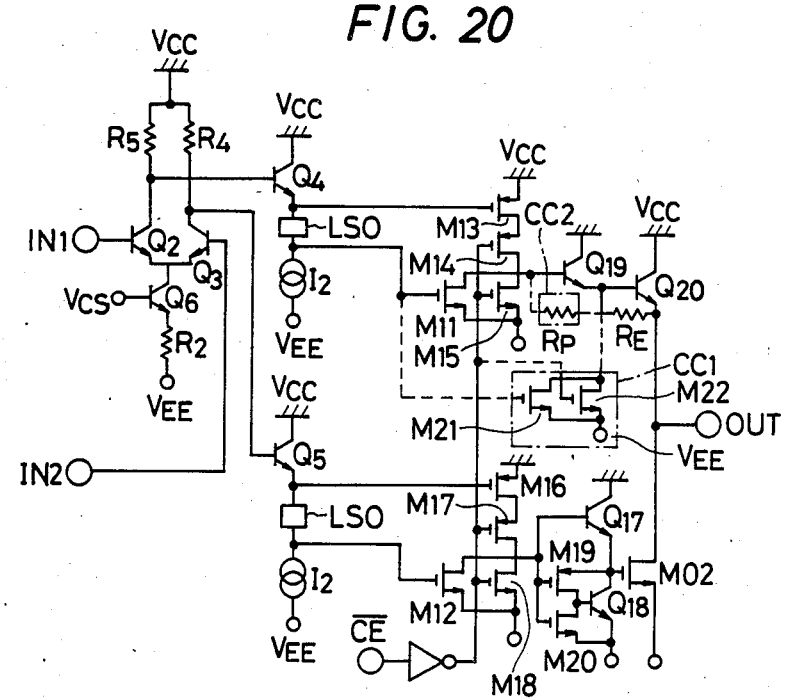

FIG. 20 is a circuit diagram showing a circuit which is constructed by adding the discharge means to the output circuit of FIG. 19.

The discharge circuit CC1 by the MOS transistor and the discharge circuit CC2 by the resistor RP are suitable, respectively, when the breakdown voltage $BV_{EBO}$ of the final stage npn transistor $Q_{20}$ is sufficiently high and low.

Figure 21:
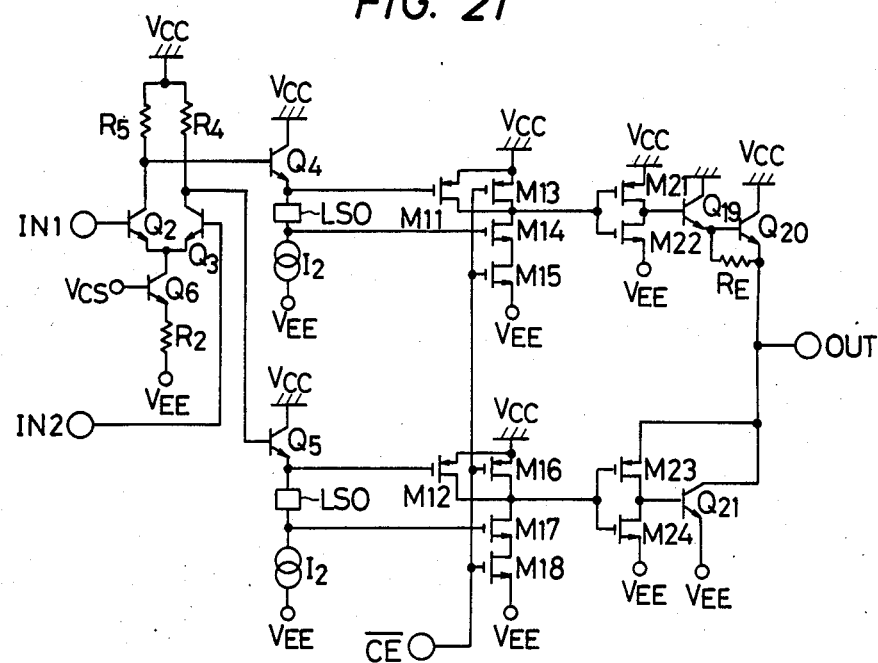

In the embodiments thus far described, the nMOS transistor is used as the lower transistor of the totempole. This is because it is intended to generate a voltage as close to the power source voltage $V_{EE}$ as possible as the low level of the output thereby to effect the TTL compatibility. Despite of this fact, however, an embodiment shown in FIG. 21 can be practised if the low level may be higher than the power source voltage $V_{EE}$ by about $1V_{BE}$ (at about 0.6 V), for example. It is natural that the drive of the lower npn transistor of the totempole may be effected by not the CMOS buffer but by the combined inverter of the bipolar transistors and the CMOS.

Figure 22:
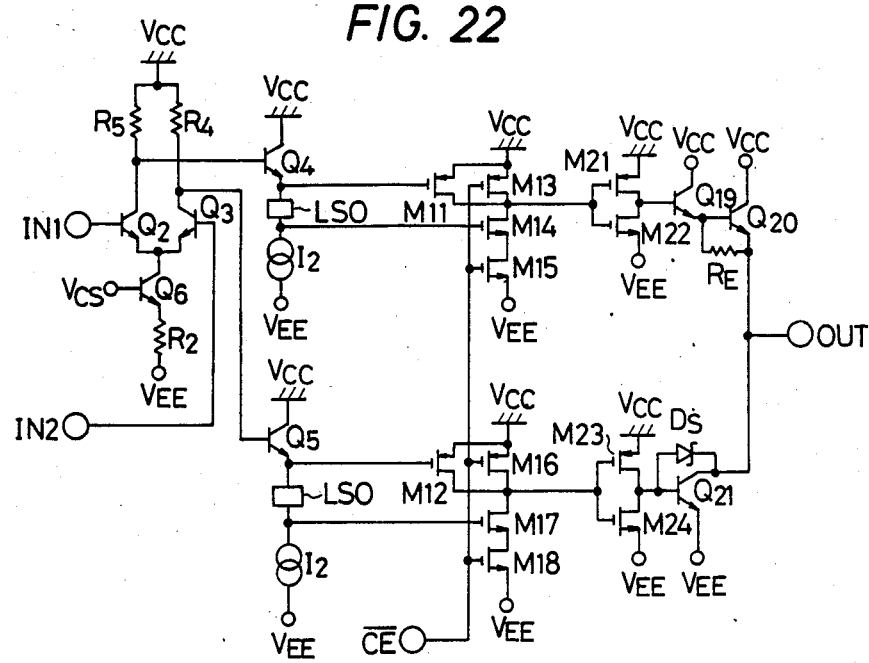

FIG. 22 is a circuit diagram showing the circuit in which a lower npn transistor $Q_{21}$ has its basecollector clamped by a Schottky barrier diode $D_S$ to prevent the saturation whereas a drive PMOS transistor M23 has its drain connected with the power source voltage $V_{CC}$ Since the power source of the CMOS buffer is used as the $V_{CC}$, the output npn transistor $Q_{21}$ is saturated deep without the clamp diode. This clamp diode can be dispensed with in case the saturation is allowable. In case the npn transistor $Q_{21}$ is mixed on the chip shared with the CMOS circuit, however, it is generally desirable not to cause the saturation so as to prevent the latch-up.

Thus, in the present invention, the gate voltages of the two transistors of the CMOS inverter are controlled indepedently of each other so that no dc current may flow through the CMOS inverter in the steady state. Moreover, the multistage connection is not required because the control is made such that the desired output level can be generated by the one stage of the CMOS inverter.

As has been described hereinbefore, according to the present invention, it is unnecessary to connect the CMOS inverters in multiple stages. Since no dc current flows in the steady state, moreover, the level converter circuit has its power consumption reduced and its delay time shortened.

Having described the specific embodiments of our bearing, it is believed obvious that modifications and variations of the present invention are possible in the light of the above teachings.

What is claimed is:

1. A level converter circuit comprising:
   a level-shift circuit for generating a first output with a small level-shift and a second output with a larger level-shift than said first output;
   a CMOS circuit including a PMOS transistor having its gate fed with said first output, and an nMOS transistor having its gate fed with said second output; and
   a current switch for giving output levels to turn off said PMOS transistor and on said NMOS transistor at its high level and to turn on said PMOS transistor and off said nMOS transistor at its low level,
   wherein said level-shift circuit is wired-"OR" through an emitter-follower of a double-emitter transistor when it is used as a decoder.

2. A level converter circuit comprising:
   a level-shift circuit for generating a first output with a small level-shift and a second output with a larger level-shift than said first output;
   a CMOS circuit including a PMOS transistor having its gate fed with said first output, and an nMOS transistor having its gate fed with said second output; and
   a current switch for giving output levels to turn off said PMOS transistor and on said nMOS transistor at its high level and to turn on said PMOS transistor and off said nMOS transistor at its low level,
   wherein said level-shift circuit and said current switch control include their current source MOS transistors having their rates controlled by a CE signal to block a current upon a non-selection.

3. A level converter circuit which coverts an input signal to output signals having predetermined first and second voltage levels, said level converter circuit comprising:
   a first level-shift circuit fed with said input signal;
   a current switch circuit fed with an output signal of said first level-shift circuit, said current switch circuit outputting a signal having a signal amplitude larger than the output signal amplitude of said first level-shift circuit;

a second level-shift circuit fed with the output signal of said current switch circuit for generating a first output with a small level-shift and a second output with a larger level-shift than said first output; and a first CMOS circuit including a PMOS transistor having its gate fed with said first output, and an nMOS transistor having its gate fed with said second output, wherein said current switch provides output levels to turn off said PMOS transistor and to turn on said nMOS transistor at its high level and to turn on said PMOS transistor and to turn off said nMOS transistor at its low level to provide said output signals having said predetermined first and second voltage levels, and further wherein said current switch circuit includes a reference terminal fed with a reference voltage controlled in accordance with fluctuations of power supply voltage or junction temperatures of transistors in said level converter circuit.

4. A level converter circuit according to claim 3, wherein said input signal is an ECL level signal and wherein said first voltage level is a power supply voltage $V_{CC}$ and said second voltage level is a power supply voltage $V_{EE}$.

5. A level converter circuit according to claim 4, wherein said current switch circuit includes a current source transistor fed with said reference voltage as a base voltage.

6. A level converter circuit according to claim 5, wherein said reference base voltage applied to said cuurent source transistor is a voltage $V_{CS}$ determined by the following equation:

$$V_{CS} = (1 - 1/\gamma)V_{EE} + (1 - n/\gamma)V_{BE},$$

in which: the ratio of a collector resistor and a current source resistor coupled to said current source transistor (i.e., $V_{EE} + nV_{BE}$) of the n times of the base-emitter voltage $V_{BE}$ of the current source transistor and a current source emitter-side power source voltage $V_{EE}$ is used at the low level of the collector of a switch transistor.

7. A level converter circuit according to claim 3, further comprising a second CMOS circuit coupled to the output of the first CMOS circuit to operate as an inverter so as to generate an inverted output and a non-inverted output as the buffer outputs of an address buffer circuit.

* * * * *